(12) United States Patent
Kuramasu

(10) Patent No.: US 7,420,395 B2
(45) Date of Patent: Sep. 2, 2008

(54) OUTPUT BUFFER CIRCUIT AND SYSTEM INCLUDING THE OUTPUT BUFFER CIRCUIT

(75) Inventor: Tomoaki Kuramasu, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 11/727,501

(22) Filed: Mar. 27, 2007

(65) Prior Publication Data

US 2007/0247193 A1    Oct. 25, 2007

(30) Foreign Application Priority Data

Mar. 29, 2006   (JP)   .............................. 2006-091392

(51) Int. Cl.
*H03K 19/094* (2006.01)
*H03K 19/0175* (2006.01)
*H03B 1/00* (2006.01)

(52) U.S. Cl. .............................. 326/83; 326/68; 326/87; 327/111

(58) Field of Classification Search ............... 326/68, 326/82, 83, 86, 87; 327/111
See application file for complete search history.

(56) References Cited

U.S. PATENT DOCUMENTS 5,949,259 A * 9/1999 Garcia ........................ 327/111
6,236,239 B1 * 5/2001 Kogushi ...................... 326/88

* cited by examiner

*Primary Examiner*—Rexford Barnie
*Assistant Examiner*—Dylan White
(74) *Attorney, Agent, or Firm*—Oliff & Berridge, PLC

(57) ABSTRACT

An output buffer circuit, which minimizes or prevents output delay of output signal and degradation of slew rate while suppressing overshoot and undershoot, is provided. In a first time period when an input signal to a gate of an N-channel output transistor changes from 'L' level to 'H' level, the gate is connected to an output terminal through a capacitor element so that the overshoot is suppressed. In addition, the output buffer circuit stores negligible electrical charge in the capacitor element prior to the first time period, which results in minimal delay in outputting a buffered signal and degradation of slew rate while suppressing undershoot when the input signal changes from 'H' level to 'L' level in the first time period.

10 Claims, 6 Drawing Sheets

OUTPUT BUFFER CIRCUIT AND SYSTEM INCLUDING THE OUTPUT BUFFER CIRCUIT

Exemplary embodiments of this invention were first described in Japanese Patent Application No. 2006-91392, which is hereby incorporated by reference in its entirety.

BACKGROUND

Exemplary embodiments of this invention relate to output buffer circuits and electrical systems including output buffer circuits.

Generally, a semiconductor integrated circuit includes an output buffer circuit that outputs a signal produced by the semiconductor integrated circuit through an output terminal. Various techniques are proposed to suppress overshoot and undershoot that may be generated in the signal outputted by the output buffer circuit.

FIG. 6 shows a conventional output buffer circuit in which overshoot and undershoot are suppressed.

An output buffer circuit 100 shown in FIG. 6 includes a P-channel output transistor 11 having a source S to which VDD potential is supplied and a drain D connected to an output terminal 22. Output buffer circuit 100 also includes an N-channel output transistor 12 having a source S to which GND potential is supplied and a drain D connected to output terminal 22.

Output buffer circuit 100 further includes capacitor elements 19 and 20, each having a first terminal connected to output terminal 22.

Further, output buffer circuit 100 includes inverters 17 and 18. Inverter 17 controls P-channel output transistor 11 by changing the potential of a gate G of P-channel output transistor 11. Inverter 18 controls N-channel output transistor 12 by changing the potential of a gate G of N-channel output transistor 12. In output buffer circuit 100 thus constructed, overshoot and undershoot are suppressed as further explained below.

Initially, an input signal A is assumed to be in 'L' level. Accordingly, both inverters 17 and 18 output 'H' level signals, and both node N1 (e.g., gate of P-channel output transistor 11) and node N2 (e.g., gate of N-channel output transistor 12) are in 'H' level. Because 'H' level signal is supplied to each of gates G of P-channel output transistor 11 and N-channel output transistor 12, P-channel output transistor 11 and N-channel output transistor 12 are in OFF- and ON-states, respectively. Accordingly, an output signal B1 at output terminal 22 is in 'L' level.

Then, input signal A changes from 'L' level to 'H' level. As a result, levels of both nodes N1 and N2 change to 'L' level. Accordingly, P-channel output transistor 11 and N-channel output transistor 12 change to ON- and OFF-states, respectively, and output signal B1 changes from 'L' level to 'H' level. Here, because capacitor element 19 is provided between output terminal 22 and node N1, overshoot generated when output signal B1 changes to 'H' level is fed back through capacitor element 19 to node N1. As a result, the overshoot is suppressed.

Next, input signal A changes from 'H' level to 'L' level. As a result, both nodes N1 and N2 change to 'H' level. Accordingly, P-channel output transistor 11 and N-channel output transistor 12 change to OFF- and ON-states, respectively, and output signal B1 changes from 'H' to 'L' level. Here, because capacitor element 20 is provided between output terminal 22 and node N2, undershoot generated when output signal B1 changes to 'L' level is fed back through capacitor element 20 to node N2. As a result, the undershoot is suppressed.

A CMOS output buffered circuit that utilizes such technique to suppress overshoot and undershoot is proposed in, for example, U.S. Pat. No. 5,121,000 to Naghshineh.

However, the technique disclosed in Naghshineh is deficient for the following reasons.

During a period when input signal A is in 'L' level, node N1 is in 'H' level, and output signal B1 is in 'L' level. Thus, a voltage corresponding to the difference between 'H' and 'L' levels is applied between the terminals of capacitor element 19. Accordingly, electrical charge corresponding to the voltage is stored in capacitor element 19. Thereafter, although node N1 starts to change from 'H' level to 'L' level when input signal A changes from 'L' level to 'H' level, a time to discharge the charge stored in capacitor element 19 is required before node N1 changes to 'L' level. As a result, change of the level of node N1 from 'H' to 'L' level is delayed during the time required to discharge the charge stored in capacitor element 19. Similarly, although node N2 starts to change from 'L' to 'H' level when input signal A changes from 'H' to 'L' level, a time to discharge the charge stored in capacitor element 20 is required before node N2 changes to 'H' level. As a result, change of the level of node N2 from 'L' to 'H' level is delayed during the time required to discharge the charge stored in capacitor element 20.

Accordingly, the timing of output signal B1 is delayed, and the slew rate of output signal B1 is degraded.

SUMMARY

Various exemplary embodiments aim to solve the problems described above. The exemplary embodiments provide output buffer circuits that can prevent delay or slew rate degradation of the output signal while suppressing overshoot and undershoot. The exemplary embodiments also provide systems including the output buffer circuits.

In order to address or solve the above-described problems, various exemplary embodiments disclosed herein provide an output buffer circuit that includes: an output transistor having a source supplied with one of VDD and GND potentials, a drain connected to an output terminal, and a gate; a capacitor element having a first terminal connected to the output terminal, and a second terminal; a driving circuit that controls the output transistor by changing a potential of the gate of the output transistor; a first switch that connects the second terminal of the capacitor element to the gate of the output transistor when it is in an ON-state; and a second switch that supplies the other one of the VDD and GND potentials to the second terminal of the capacitor element when it is in an ON-state. The driving circuit operates such that the output transistor changes from an OFF-state to an ON-state during a first period and such that the output transistor is in the OFF-state during a second period prior to the first period. The first switch is in the ON-state and the second switch is in an OFF-state during the first period and, the first switch is in an OFF-state and the second switch is in the ON-state during the second period.

According to the various exemplary embodiments, the driving circuit may include an inverter that receives an input signal and supplies an inverted input signal to the gate of the output transistor; and each of the first and the second switches may switch between the ON- and OFF-states synchronously with a change of a logical level of the input signal.

In order to address or solve the above-described problems, additional exemplary embodiments disclosed herein provide a system that includes an output buffer circuit and a resistor.

The output buffer circuit includes: an output transistor having a source supplied with one of VDD and GND potentials, a drain connected to an output terminal which is supplied with the other one of the VDD and GND potentials through the resistor, and a gate; a capacitor element having a first terminal connected to the output terminal, and a second terminal; a driving circuit that controls the output transistor by changing a potential of the gate of the output transistor; a first switch that connects the second terminal of the capacitor element to the gate of the output transistor when it is in an ON-state; and a second switch that supplies the other one of the VDD and GND potentials to the second terminal of the capacitor element when it is in an ON-state. The driving circuit operates such that the output transistor changes from an OFF-state to an ON-state during a first period and such that the output transistor is in the OFF-state during a second period prior to the first period. The first switch is in the ON-state and the second switch is in an OFF-state during the first period, and the first switch is in an OFF-state and the second switch is in the ON-state during the second period.

Further exemplary embodiments disclosed herein provide an output buffer circuit that includes: a P-channel output transistor having a source supplied with VDD potential, a drain connected to an output terminal, and a gate; an N-channel output transistor having a source supplied with GND potential, a drain connected to the output terminal, and a gate; a first and a second capacitor element each having a first terminal connected to the output terminal, and a second terminal; a first driving circuit that controls the P-channel output transistor by changing a potential of the gate of the P-channel output transistor; a second driving circuit that controls the N-channel output transistor by changing a potential of the gate of the N-channel output transistor; a first switch that connects the second terminal of the first capacitor element to the gate of the P-channel output transistor when it is in an ON-state; a second switch that supplies the GND potential to the second terminal of the first capacitor element when it is in an ON-state; a third switch that connects the second terminal of the second capacitor element to the gate of the N-channel output transistor when it is in an ON-state; and a fourth switch that supplies the VDD potential to the second terminal of the second capacitor element when it is in an ON-state. The first driving circuit operates such that the P-channel output transistor changes from an OFF-state to an ON-state during a first period and such that the P-channel output transistor is in the OFF-state during a second period prior to the first period. The second driving circuit operates such that the N-channel output transistor changes from an OFF-state to an ON-state during a third period and such that the N-channel output transistor is in the OFF-state during a fourth period prior to the third period. The first switch is in the ON-state and the second switch is in an OFF-state during the first period, and the first switch is in an OFF-state and the second switch is in the ON-state during the second period. The third switch is in the ON-state and the fourth switch is in an OFF-state during the third period, and the third switch is in an OFF-state and the fourth switch is in the ON-state during the fourth period.

According to additional exemplary embodiments, the first driving circuit may include a first inverter that receives a first input signal and supplies an inverted first input signal to the gate of the P-channel output transistor, where each of the first and the second switches changes between the ON- and OFF-states synchronously with a change of a logical level of the first input signal. The second driving circuit may include a second inverter that receives a second input signal and supplies an inverted second input signal to the gate of the N-channel output transistor, where each of the third and the fourth switches changes between the ON- and OFF-states synchronously with a change of a logical level of the second input signal.

BRIEF DESCRIPTION OF THE DRAWINGS

Various exemplary details of output buffer circuits and systems are described with reference to the following figures, wherein.

DETAIL DESCRIPTION OF EMBODIMENTS

First Embodiment

Figure 1:
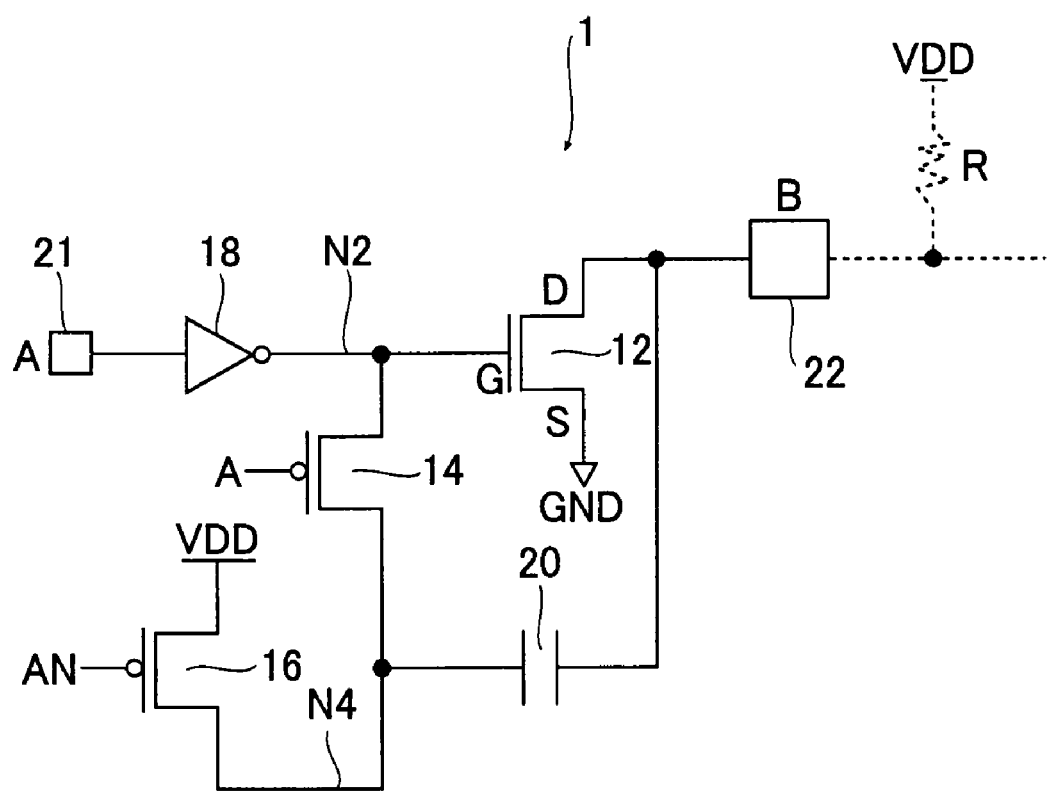
FIG. 1 is a circuit diagram showing a first exemplary output buffer circuit according to a first exemplary embodiment.

FIG. 1 is a circuit diagram showing an exemplary output buffer circuit according to a first exemplary embodiment.

As shown in FIG. 1, an output buffer circuit 1 includes an N-channel output transistor 12 having a source S to which GND potential is supplied and a drain D connected to an output terminal 22. One terminal of a pull-up resistor R, which is provided outside of output buffer circuit 1, is also connected to output terminal 22. The other terminal of pull-up resistor R is supplied with VDD potential. Thus, in a system including output buffer circuit 1 and pull-up resistor R, output terminal 22 is supplied with VDD potential through resistor R.

Output buffer circuit 1 also includes a capacitor element 20 having a terminal connected to output terminal 22.

An inverter 18 is also provided in output buffer circuit 1. An input signal A is input to inverter 18 through an input terminal 21. Inverter 18 changes the potential of a gate G of N-channel output transistor 12 and controls N-channel output transistor 12.

Output buffer circuit 1 further includes a P-channel transistor 14, which may serve as a first switch, and a P-channel transistor 16, which may serve as a second switch. P-channel transistor 14 connects the other terminal of capacitor element 20 to gate G of N-channel output transistor 12. P-channel transistor 16 supplies VDD potential to the other terminal of capacitor element 20.

Input signal A is also input to P-channel transistor 14 and an inverted input signal AN, which has logically inverted level of the level of input signal A, is input to P-channel transistor 16.

Figure 6:
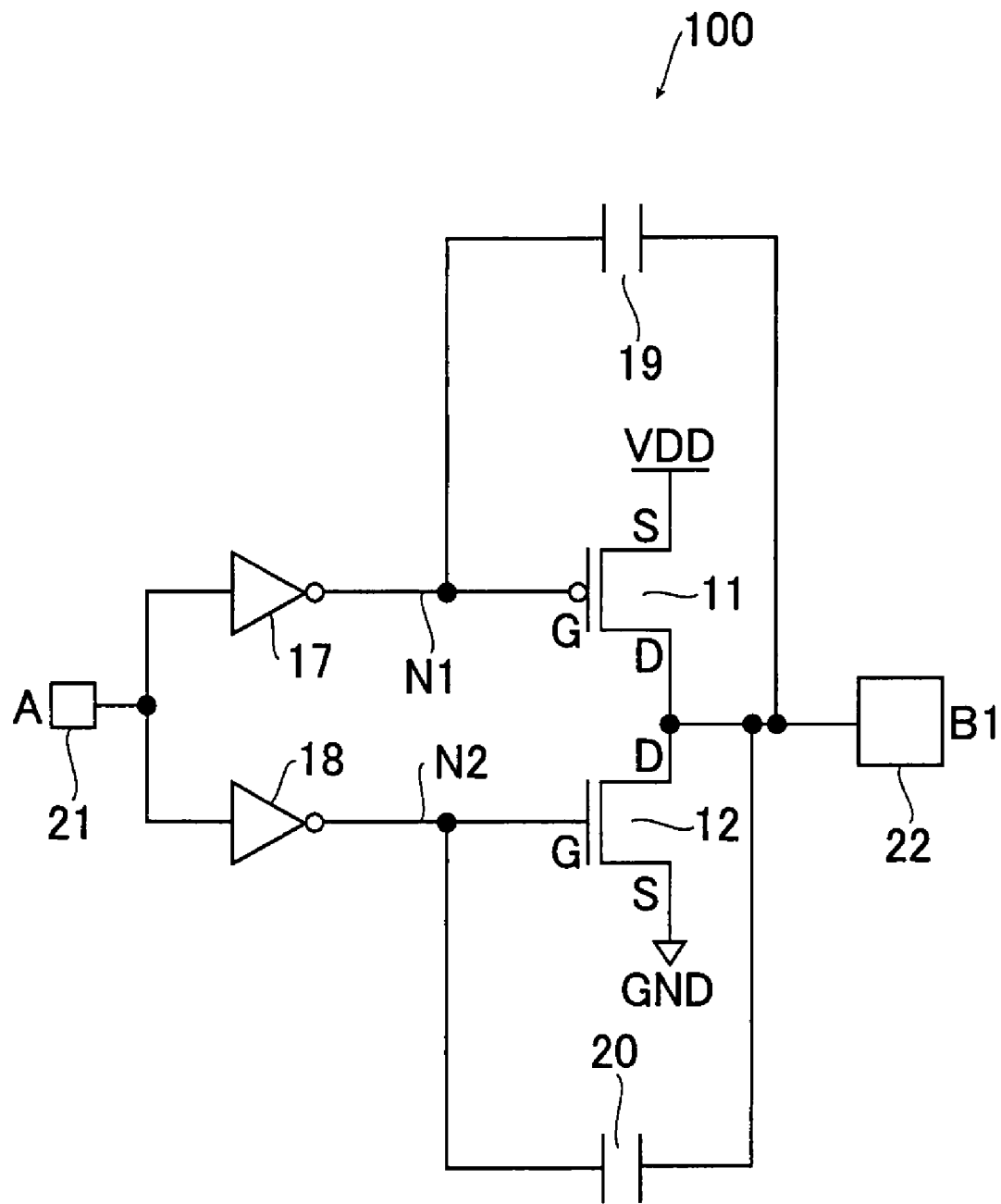
FIG. 6 is a circuit diagram showing a conventional output buffer circuit in which overshoot and undershoot are suppressed.

Similar to output buffer circuit 100 shown in FIG. 6, during a period (a first period) after input signal A changes from 'H' level to 'L' level, inverter 18 changes the level of a node N2 (gate G of N-channel output transistor 12) from 'L' level to 'H' level. In other words, inverter 18 operates during the first period such that N-channel output transistor 12 changes from OFF-state to ON-state. Moreover, because input signal A and inverted input signal AN are input to P-channel transistors 14 and 16, respectively, P-channel transistor 14 is in ON-state and P-channel transistor 16 is in OFF-state during the first period.

On the other hand, during a period (a second period) prior to the first period, input signal A is in 'H' level. Accordingly, N-channel output transistor 12 is in OFF-state. In other words, inverter 18 operates during the second period such that N-channel output transistor 12 is in OFF-state. Moreover, because input signal A and inverted input signal AN are input to P-channel transistors 14 and 16, respectively, P-channel transistor 14 is in OFF-state and P-channel transistor 16 is in ON-state during the second period.

Exemplary output buffer circuit 1 operates as follows.

During the second period prior to the first period, input signal A is in 'H' level. Accordingly, node N2 is in 'L' level and N-channel output transistor 12 is in OFF-state. Here, because output terminal 22 is supplied with VDD potential through pull-up resistor R, a signal B at output terminal 22 is in 'H' level.

Additionally, input signal A and inverted input signal AN inputted to P-channel transistors 14 and 16 are in 'H' and 'L' levels, respectively. Because P-channel transistor 16 is in ON-state, a node N4 (the other terminal of capacitor element 20) is in 'H' level. Accordingly, both terminals of capacitor element 20 are in 'H' level. As a result, no charge is stored in capacitor element 20.

Thus, capacitor element 20 enters a state in which no charge is stored during the second period, and then during the first period, input signal A changes from 'H' level to 'L' level, causing the logical level at node N2 to change from 'L' level to 'H' level. Further, inverted input signal AN changes from 'L' level to 'H' level.

Because input signal A and inverted input signal AN become 'L' and 'H' levels, respectively, P-channel transistors 14 and 16 change to ON- and OFF- states, respectively. Because P-channel transistor 14 changes to ON-state, output terminal 22 and node N2 are connected through capacitor element 20. Capacitor element 20 provides an analog connection between output terminal 22 and node N2. That is, the potentials of output terminal 22 and node N2 are not always the same, but may differ depending on the charge stored in capacitor element 20.

As previously noted, capacitor element 20 is in a discharged state when the connection is made. Further, N-channel output transistor 12 is still in OFF-state during the period when the level of node N2 changes from 'L' level to 'H' level. Accordingly, output terminal 22 stays in 'H' level. As a result, the connection to capacitor element 20 does not delay the change of the level of node N2 to 'H' level. Thus, the logical level at node N2 changes rapidly to 'H' level.

The change of the level of node N2 to 'H' level changes N-channel output transistor 12 from OFF-state to ON-state, and signal B at output terminal 22 changes from 'H' level to 'L' level. The undershoot generated during the change of signal B to 'L' level is fed back to node N2 through capacitor element 20. Accordingly, the undershoot is suppressed.

Thus, the response time for node N2 to change from 'L' level to 'H' level is short in output buffer circuit 1. That is, delay or degradation of slew rate of the output signal B is prevented while suppressing undershoot.

In exemplary output buffer circuit 1, P-channel transistors 14 and 16 may serve as first and second switches. Furthermore, input signal A, which may serve as input to the driving circuit, and inverted input signal AN are input to the gates of P-channel transistors 14 and 16. Thereby, the first and the second switches switch between ON- and OFF-states synchronously in response to a change in the logical level of input signal A. Accordingly, in output buffer circuit 1 shown in FIG. 1, the first switch maintains ON-state throughout the period in which input signal A is in 'L' level, and the second switch maintains ON-state throughout the period in which input signal A is in 'H' level. Exemplary output buffer circuit 1 thus constructed has a simple structure.

However, in various exemplary output buffer circuits according to this invention, it is not required that the first and the second switches switch between OFF- and ON-states synchronously in response to a change in the input signal's logical level.

As can be easily understood from the explanation above, the first switch is required to be in ON-state during the first period. During the first period, output transistor 12 changes from OFF-state to ON-state and undershoot is generated due to the change of the level of signal B at output terminal 22. Accordingly, if the first switch is in ON-state during the first period, the undershoot generated at the output terminal may be fed back through capacitor element 20 to gate G of output transistor 12 and the undershoot can be suppressed.

Similarly, the second switch is required to be in ON-state during the second period prior to the first period so that it is possible to move from the second period to the first period under a state in which no charge is stored in capacitor element 20. As a result, output delay of the response signal and degradation of slew rate during the first period may be prevented.

Here, during the second period, it is possible to decrease the amount of charge stored in capacitor element 20 to zero or a negligible amount by making the potentials of both terminals of capacitor element 20 equal to each other by decreasing the resistance of the second switch (e.g., P-channel transistor 16). However, in various exemplary output buffer circuits, it is not necessary to eliminate the amount of charge stored in capacitor element 20 during the second period to zero.

In conventional output circuit 100 as shown in FIG. 6, an amount of charge corresponding to the difference between 'H' and 'L' levels is stored in capacitor element 19. This causes long delay and significant degradation of slew rate when conventional output buffer circuit 100 enters the first period. In contrast, various exemplary output buffer circuits (e.g., output buffer circuit 1) disclosed herein minimize the delay in the response time and degradation of slew rate by decreasing the amount of charge stored in capacitor element 19 in the second period prior to the first period. In other words, an acceptable amount of charge may remain in capacitor element 19 in the second period, depending on the desired response time and slew rate of the exemplary output buffer circuits.

In output buffer circuit 1 shown in FIG. 1 according to the first exemplary embodiment disclosed herein, one-stage inverter 18 is used as the driving circuit. However, in various exemplary output buffer circuits according to this invention, the driver circuit is not limited to a one-stage inverter. For example, buffers or inverters in which multiple inverters are connected in series may be used as the driving circuit. Also, for example, a NAND gate in which one of the input terminals is used as an enable signal input terminal, which operates as an inverter when an enable signal is input to the enable input terminal, may be used as the driving circuit.

Further, output buffer circuit 1 as shown in FIG. 1 according to the first exemplary embodiment utilizes N-channel transistor 12 as the output transistor. It is also possible to construct various exemplary output buffer circuits according to the first exemplary embodiment of this invention using P-channel transistors as the output transistor.

Second Embodiment

Figure 2:
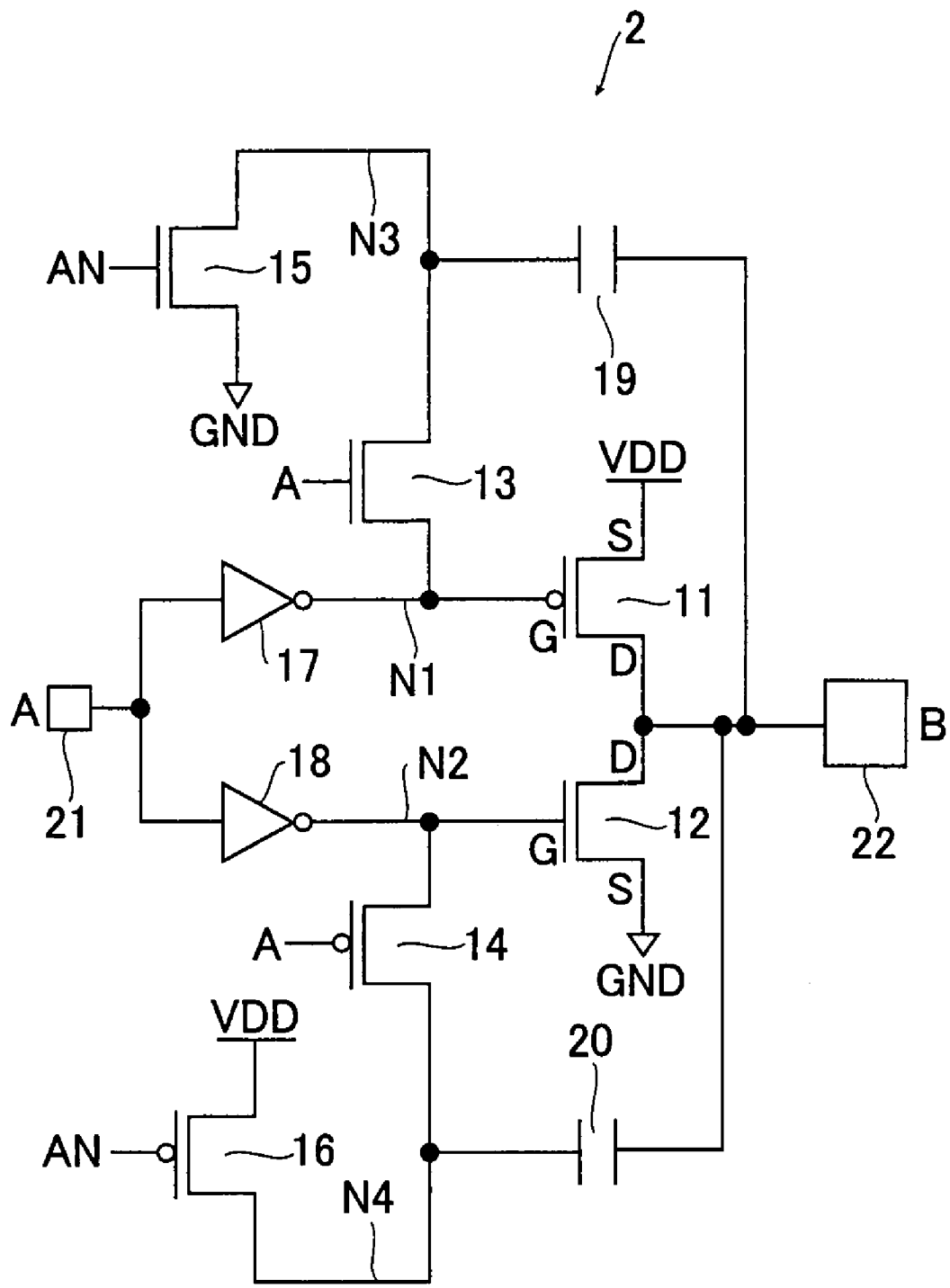
FIG. 2 is a circuit diagram showing a second exemplary output buffer circuit according to a second exemplary embodiment.

FIG. 2 shows an exemplary output buffer circuit 2 according to a second exemplary embodiment disclosed herein.

Output buffer circuit 2 shown in FIG. 2 includes a P-channel output transistor 11 and an N-channel output transistor 12. A source S of P-channel output transistor 11 is supplied with VDD potential and a drain D thereof is connected to output terminal 22. A source S of N-channel output transistor 12 is supplied with GND potential and drain D thereof is connected to output terminal 22.

Output buffer circuit 2 also includes capacitor elements 19 and 20, which may serve as a first and a second capacitor element, respectively. A terminal from each of capacitor elements 19 and 20 is connected to output terminal 22.

Output buffer circuit 2 also includes inverters 17 and 18, which may serve as a first and a second driving circuit, respectively. Inverters 17 and 18 invert an input signal A, which may serve as first and second input signals, and supply inverted input signals to a gate G of P-channel output transistor 11 and a gate G of N-channel output transistor 12, respectively. Inverter 17 changes potential of gate G of P-channel output transistor 11 and controls P-channel output transistor 11. Inverter 18 changes potential of gate G of N-channel output transistor 12 and controls N-channel output transistor 12.

Output buffer circuit 2 further includes N-channel transistors 13 and 15, which may respectively serve as a first and a second switch. N-channel transistor 13 connects the other terminal of capacitor element 19 to gate G of P-channel transistor 11. N-channel transistor 15 supplies GND potential to the other terminal of capacitor element 19.

Output buffer circuit 2 also includes P-channel transistors 14 and 16, which may respectively serve as a third and a fourth switch. P-channel transistor 14 connects the other terminal of capacitor element 20 to gate G of N-channel output transistor 12. P-channel transistor supplies VDD potential to the other terminal of capacitor element 20.

Input signal A is input to first and second inverters 17 and 18 through an input terminal 21 of output buffer circuit 2. Input signal A is also input to N-channel transistor 13 and P-channel transistor 14. On the other hand, an inverted input signal AN is input to N-channel transistor 15 and P-channel transistor 16.

Similar to conventional output buffer circuit 100 as shown in FIG. 6, during a period (a first period) after input signal A changes from 'L' level to 'H' level, inverter 17 changes the level of a node N1 (gate of the P-channel output transistor 11) from 'H' level to 'L' level. In other words, inverter 17 operates during the first period to cause P-channel output transistor 11 to change from OFF-state to ON-state. Moreover, because input signal A and inverted input signal AN are input to N-channel transistors 13 and 15, respectively, N-channel transistor 13 is in ON-state and N-channel transistor 15 is in OFF-state during the first period. Note that a signal B at output terminal 22 changes from 'L' level to 'H' level during the first period.

Further, during a period (a third period) after input signal A changes from 'H' level to 'L' level, inverter 18 changes the level of a node N2 (gate of the N-channel output transistor 12) from 'L' level to 'H' level. In other words, inverter 18 operates during the third period to cause N-channel output transistor 12 to change from OFF-state to ON-state. Moreover, because input signal A and inverted input signal AN are input to P-channel transistors 14 and 16, respectively, P-channel transistor 14 is in ON-state and P-channel transistor 16 is in OFF-state during the third period. Note that signal B at output terminal 22 changes from 'H' level to 'L' level during the third period.

N-channel transistors 13 and 15 switch between ON- and OFF-states synchronously when the logical level of input signal A changes. N-channel transistors 13 and 15 also switch between ON- and OFF-states synchronously when the logical level of inverted input signal AN changes. Further, P-channel transistors 14 and 16 switch between ON- and OFF-states synchronously when the logical level of input signal A changes. P-channel transistors 14 and 16 also switch between ON- and OFF-states synchronously when the logical level of inverted input signal AN changes.

The operation of exemplary output buffer circuit 2 thus constructed is disclosed in further detail below with reference to FIGS. 3 and 4.

Figure 3:
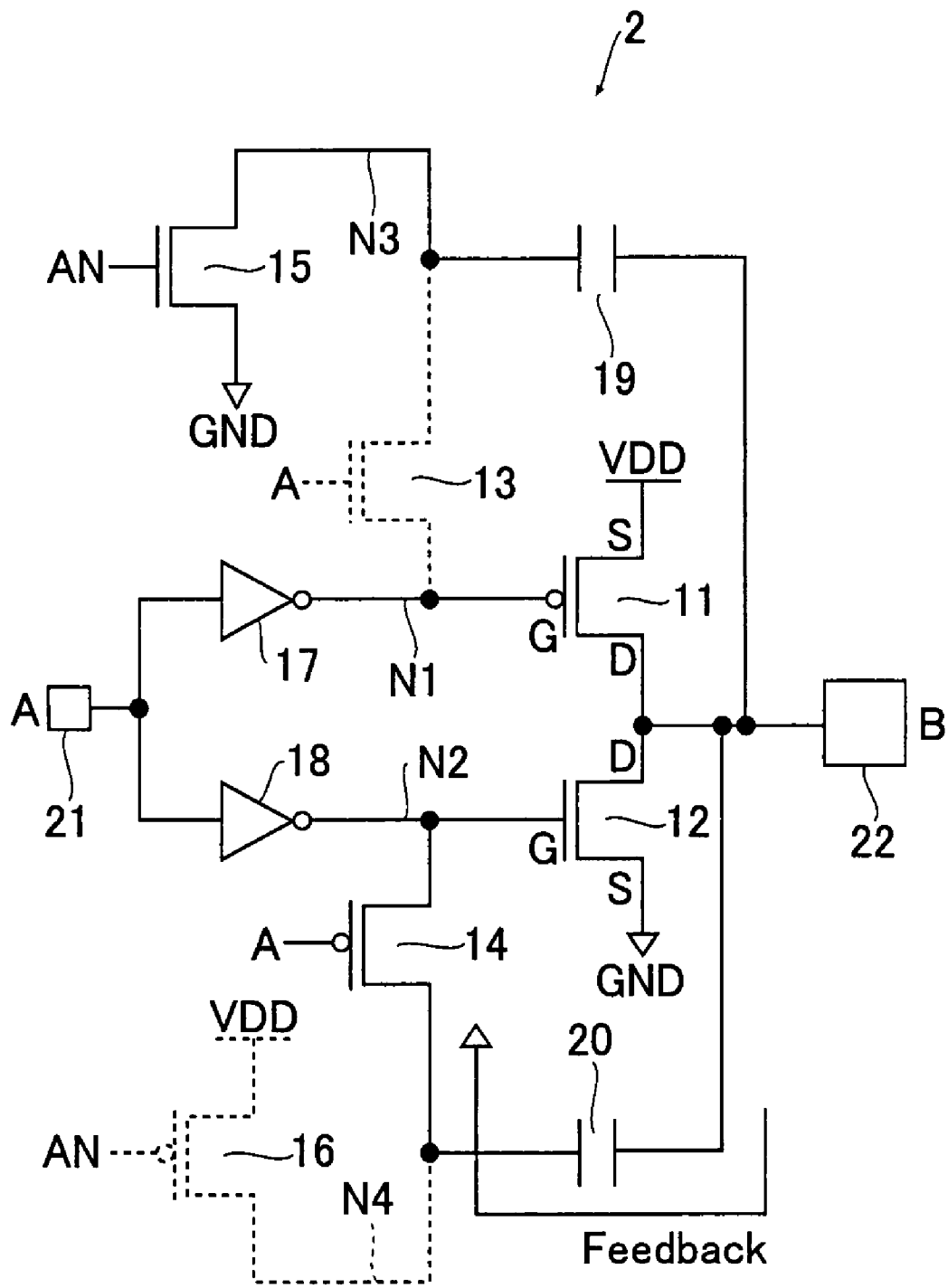
FIG. 3 is a circuit diagram for illustrating an operation of the exemplary output buffer circuit shown in FIG. 2 during a second period prior to a first period.

FIG. 3 illustrates the operation of output buffer circuit 2 shown in FIG. 2 during the second period prior to the first period. FIG. 4 illustrates the operation of exemplary output buffer circuit 2 during the first period.

P-channel transistor 16 and N-channel transistor 13 are shown with broken lines in FIG. 3 to indicate that they are in OFF-state. Similarly, P-channel transistor 14 and N-channel transistor 15 are shown with broken lines in FIG. 4 to indicate that they are in OFF-state.

In output buffer circuit 2 as shown in FIG. 3, during the second period prior to the first period, input signal A is in 'L' level. Accordingly, both nodes N1 and N2 are in 'H' level. As a result, P-channel output transistor 11 and N-channel output transistor 12 are in OFF- and ON-states, respectively, and signal B at the output terminal 22 is in 'L' level. In other words, inverter 17 operates during the second period to cause P-channel output transistor 11 to be in OFF-state.

Further, input signal A which serves as input to N-channel transistor 13 and inverted input signal AN which serves as input to N-channel transistor 15 are in 'L' and 'H' levels, respectively, causing N-channel transistors 13 and 15 to be in OFF- and ON-states, respectively. As a result, a node N3 (the other terminal of capacitor element 19) is in 'L' level and no charge is stored in capacitor element 19.

Thus, capacitor element 19 stores no or a negligible amount of charge during the second period prior to entering the first period. The operation during the first period is further described below with reference to FIG. 4.

During the first period, input signal A changes to 'H' level and node N1 starts to change from 'H' level to 'L' level.

As a result, N-channel transistors 13 and 15 respectively switch to ON- and OFF-states during the first period, which causes ON-state N-channel transistor 13 to provide an analog connection between output terminal 22 and node N1 through capacitor element 19.

As explained above, capacitor element 19 stores no or a negligible amount of electrical charge during the second period. In addition, P-channel output transistor 11 remains in OFF-state and output terminal 22 remains in 'L' level when node N1 changes from 'H' level to 'L' level. Accordingly, even though capacitor element 19 is connected, the change of node N1 to 'L' level is not delayed. This allows node N1 to rapidly change its logical level to 'L' level. The change of node N1 to 'L' level causes P-channel output transistor 11 to change from OFF-state to ON-state, which causes signal B at output terminal 22 to change from 'L' level to 'H' level. The overshoot generated during the change of signal B from 'L' level to 'H' level is suppressed because the overshoot is fed back though capacitor element 19 to node N1. p As explained above, in exemplary output buffer circuit 2 as shown in FIG.

2, node N1 rapidly changes from 'H' level to 'L' level, thus minimizing or preventing any output delay of output signal B and degradation of slew rate while suppressing overshoot when input signal A changes from 'L' to 'H' level.

Next, the operation of exemplary output buffer circuit 2 during the third period and a fourth period prior to the third period is further explained. Firstly, the operation in the fourth period is described in reference to FIG. 4.

During the fourth period, which is prior to the third period, input signal A is in 'H' level, causing both nodes N1 and N2 to be in 'L' level. This causes P-channel output transistor 11 and N-channel output transistor 12 to be in ON- and OFF-states, respectively, and signal B at output terminal 22 to be in 'H' level. In other words, inverter 18 operates during the fourth period to cause N-channel output transistor 18 to be in OFF-state.

Further, because input signal A which serves as input to P-channel transistor 14 and inverted input signal AN which serves as input to P-channel transistor 16 are in 'H' level and 'L' level, respectively, P-channel transistors 14 and 16 are in OFF- and ON-states, respectively. Because P-channel transistor 16 is in ON-state, a node N4 (the other terminal of capacitor element 20) is in 'H' level and no charge is stored in capacitor element 20.

Thus, capacitor element 20 stores no or a negligible amount of charge during the fourth period prior to entering the third period. The operation during the third period is described in further detail below with reference to FIG. 3.

During the third period, input -signal A changes to 'L' level and node N2 starts to change from 'L' level to 'H' level.

Further, input signal A which serves as input to P-channel transistor 14 and inverted input signal AN which serves as input to P-channel transistor 16 change to 'L' level and 'H' level, respectively. This causes P-channel transistors 14 and 16 to switch to ON- and OFF-states, respectively. ON-state P-channel transistor 14 provides an analog connection between output terminal 22 and node N2 through capacitor element 20.

As explained above, capacitor element 20 stores no or a negligible amount of charge during the fourth period. In addition, N-channel output transistor 12 remains in OFF-state and output terminal 22 remains in 'H' level when node N2 changes from 'L' level to 'H' level. Accordingly, even though capacitor element 20 is connected, the change in the logical level of node N2 to 'H' level is not delayed. As a result, node N2 rapidly changes to 'H' level. The logical level change of node N2 to 'H' level causes N-channel output transistor 12 to switch from OFF-state to ON-state, which causes signal B at output terminal 22 to change from 'H' level to 'L' level. The undershoot generated during the change of signal B from 'H' level to 'L' level is suppressed because the undershoot is fed back though capacitor element 20 to node N2.

As explained above, in exemplary output buffer circuit 2 as shown in FIG. 2, node N2 rapidly changes in logical level from 'L' level to 'H' level, thus minimizing or preventing any output delay of output signal B and degradation of slew rate while suppressing undershoot when input signal A changes from 'H' to 'L' level.

Figure 5:
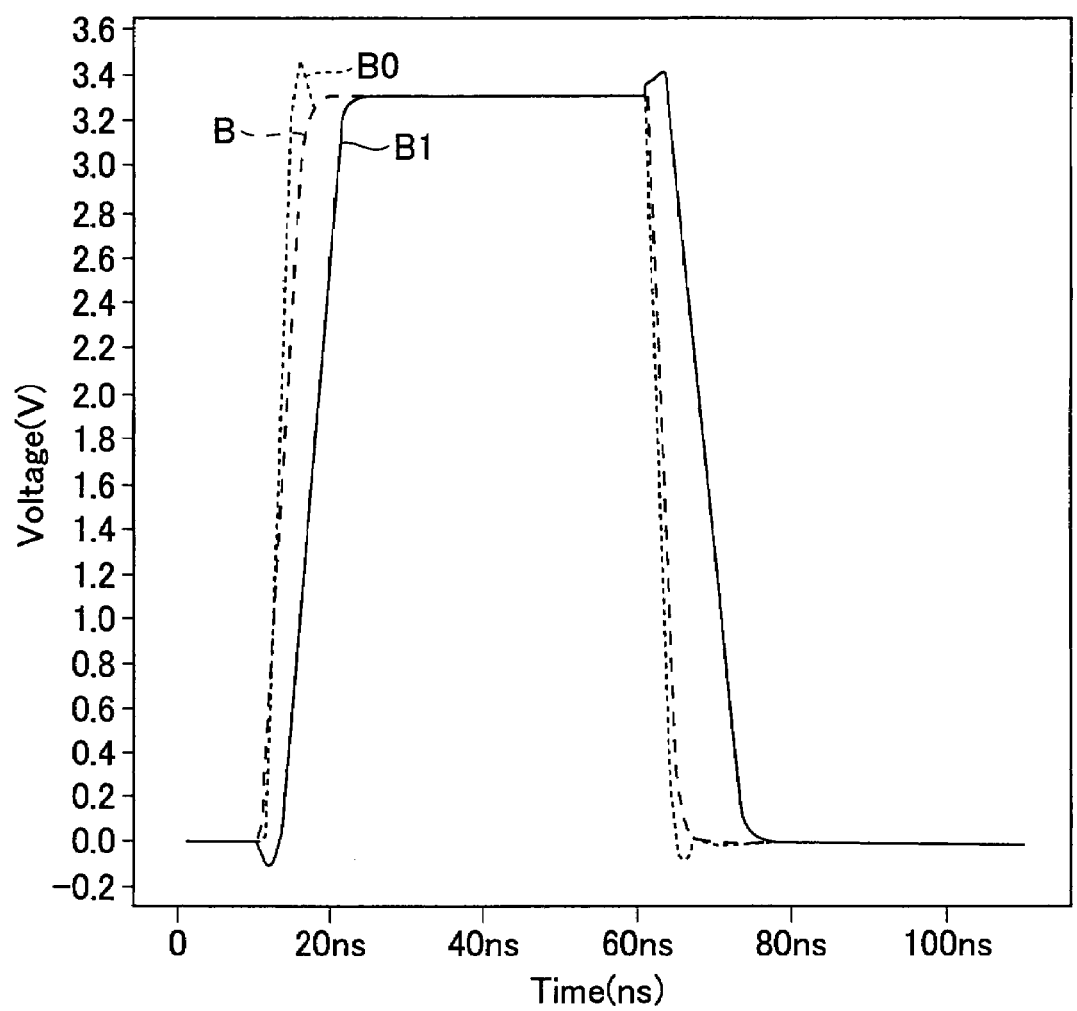
FIG. 5 is a drawing that illustrates an output waveform of an exemplary output buffer circuit according to the second exemplary embodiment in comparison to output waveforms of conventional output buffer circuits.

FIG. 5 shows an output signal waveform of exemplary output buffer circuit 2 compared to output waveforms of conventional output buffer circuits.

An output waveform B as shown in FIG. 5 is a result of simulation of the waveform of signal B at output terminal 22 of output buffer circuit 2 as shown in FIG. 2. Here, the simulation was made assuming that the driving capability of output buffer circuit 2 is 4 mA. Other conditions for the simulation were as follows.

Capacitance of the feedback capacitor elements (e.g., elements 19 and 20): 1.15 pF Load capacitance: 20 pF Inductance of the power supply: 10 nH On the other hand, an output waveform B1 as shown in FIG. 5 illustrates an output waveform of conventional output buffer circuit 100 as shown in FIG. 6 in which overshoot and undershoot are suppressed.

Further, an output waveform B0 as shown in FIG. 5 shows an output waveform of a conventional output buffer circuit in which overshoot and undershoot are not suppressed.

In exemplary output buffer circuit 2 according to the second exemplary embodiment, as output waveform B in FIG. 5 illustrates, output delay of the output signal and degradation of slew rate are prevented while suppressing overshoot and undershoot.

On the other hand, in conventional output buffer circuit 100 as shown in FIG. 6, as output waveform B1 in FIG. 5 shows, although overshoot and undershoot are suppressed, the output signal is significantly delayed and the slew rate is significantly degraded.

Further, in the conventional output buffer circuit in which overshoot and undershoot are not suppressed, as output waveform B0 illustrates, significant overshoot and undershoot are generated.

Figure 4:
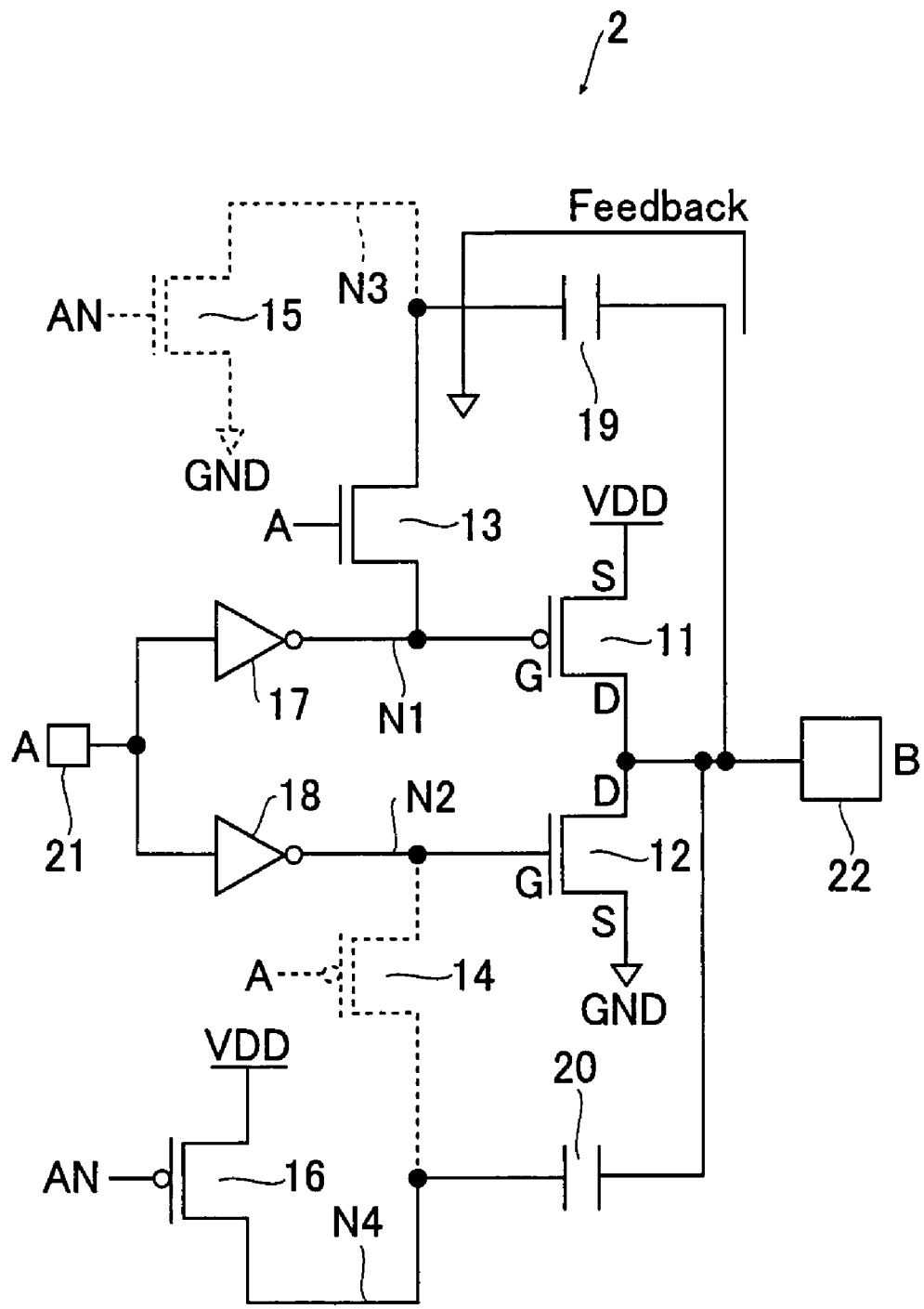
FIG. 4 is a circuit diagram for illustrating an operation of the exemplary output buffer circuit shown in FIG. 2 during the first period.

Thus far, an exemplary output buffer circuit according to the second exemplary embodiment is disclosed in detail with reference to FIGS. 2, 3, and 4. Similar to the first exemplary embodiment, however, the second exemplary embodiment is not limited to exemplary output buffer circuit 2 shown in FIGS. 2, 3, and 4. For example, the discussions made for first exemplary embodiment may similarly be applied to the operation of the switches and the amount of electrical charges in the capacitor elements in the second and the fourth period in the second exemplary embodiment. The discussions may also be similarly applied to the driving circuits of the second exemplary embodiment.

Moreover, in the exemplary output buffer circuit according to the second exemplary embodiment, the first and the second driving circuit may be a common driving circuit that supplies a common output signal to gates of the P-channel output transistor and the N-channel output transistor.

The foregoing descriptions of the invention have been presented for purposes of illustration and description. They are not exhaustive and do not limit the invention to the precise form disclosed. Modifications and variations are possible in light of the above teachings or may be acquired from practicing of the invention.

Further, while this invention has been described with specific embodiments thereof, it is evident that many alternatives, modifications, and variations will be apparent to those skilled in the art. Accordingly, the preferred embodiments of the invention as set forth herein are intended to be illustrative, not limiting. Various changes may be made without departing from the spirit and scope of the invention.

What is claimed is:

1. An output buffer circuit comprising:
an output transistor having a source supplied with a first potential selected from a VDD potential and a GND potential, a drain connected to an output terminal, and a gate;
a capacitor element having a first terminal connected to the output terminal, and a second terminal;
a driving circuit that controls the output transistor by changing a potential of the gate of the output transistor, the driving circuit operates such that the output transistor changes from an OFF-state to an ON-state during a first period and such that the output transistor is in the OFF-state during a second period prior to the first period;

a first switch that connects the second terminal of the capacitor element to the gate of the output transistor when it is in an ON-state; and a second switch that supplies a second potential selected from the VDD potential and the GND potential, where the second potential is different from the first potential, to the second terminal of the capacitor element when it is in an ON-state, wherein the first switch is in the ON-state and the second switch is in an OFF-state during the first period, and the first switch is in an OFF-state and the second switch is in the ON-state during the second period.

2. The output buffer circuit according to claim 1, wherein:

the driving circuit includes an inverter that receives an input signal and supplies an inverted input signal to the gate of the output transistor; and each of the first and the second switches changes between the ON- and OFF-states synchronously with a change of a logical level of the input signal.

3. The output buffer circuit according to claim 2, wherein the first switch is a first P-channel transistor having a gate to which the input signal is input, and the second switch is a second P-channel transistor having a gate to which the inverted input signal is input.

4. A system including an output buffer circuit and a resistor, the output buffer circuit comprising:

an output transistor having a source supplied with a first potential selected from a VDD potential and a GND potential, a drain connected to an output terminal which is supplied with a second potential selected from the VDD and GND potentials through the resistor, and a gate, wherein the second potential is different from the first potential;

a capacitor element having a first terminal connected to the output terminal, and a second terminal;

a driving circuit that controls the output transistor by changing a potential of the gate of the output transistor, the driving circuit operates such that the output transistor changes from an OFF-state to an ON-state during a first period and such that the output transistor is in the OFF-state during a second period prior to the first period;

a first switch that connects the second terminal of the capacitor element to the gate of the output transistor when it is in an ON-state; and a second switch that supplies the second potential to the second terminal of the capacitor element when it is in an ON-state, wherein the first switch is in the ON-state and the second switch is in an OFF-state during the first period, and the first switch is in an OFF-state and the second switch is in the ON-state during the second period.

5. The system according to claim 4, wherein:

the driving circuit includes an inverter that receives an input signal and supplies an inverted input signal to the gate of the output transistor; and each of the first and the second switches changes between the ON- and OFF-states synchronously with a change of a logical level of the input signal.

6. The system according to claim 5, wherein the first switch is a first P-channel transistor having a gate to which the input signal is input, and the second switch is a second P-channel transistor having a gate to which the inverted input signal is input.

7. An output buffer circuit comprising:

a P-channel output transistor having a source supplied with a VDD potential, a drain connected to an output terminal, and a gate;

an N-channel output transistor having a source supplied with a GND potential, a drain connected to the output terminal, and a gate;

a first and a second capacitor elements each having a first terminal connected to the output terminal, and a second terminal;

a first driving circuit that controls the P-channel output transistor by changing a potential of the gate of the P-channel output transistor, the first driving circuit operates such that the P-channel output transistor changes from an OFF-state to an ON-state during a first period and such that the P-channel output transistor is in the OFF-state during a second period prior to the first period;

a second driving circuit that controls the N-channel output transistor by changing a potential of the gate of the N-channel output transistor, the second driving circuit operates such that the N-channel output transistor changes from an OFF-state to an ON-state during a third period and such that the N-channel output transistor is in the OFF-state during a fourth period prior to the third period;

a first switch that connects the second terminal of the first capacitor element to the gate of the P-channel output transistor when it is in an ON-state;

a second switch that supplies the GND potential to the second terminal of the first capacitor element when it is in an ON-state;

a third switch that connects the second terminal of the second capacitor element to the gate of the N-channel output transistor when it is in an ON-state; and a fourth switch that supplies the VDD potential to the second terminal of the second capacitor element when it is in an ON-state;

wherein:

the first switch is in the ON-state and the second switch is in an OFF-state during the first period, and the first switch is in an OFF-state and the second switch is in the ON-state during the second period; and the third switch is in the ON-state and the fourth switch is in an OFF-state during the third period, and the third switch is in an OFF-state and the fourth switch is in the ON-state during the fourth period.

8. The output buffer circuit according to claim 7, wherein the first driving circuit and the second driving circuit constitutes a common driving circuit.

9. The output buffer circuit according to claim 7, wherein:

the first driving circuit includes a first inverter that receives a first input signal and supplies an inverted first input signal to the gate of the P-channel output transistor, where each of the first and the second switches changes between the ON- and OFF-states synchronously with a change of a logical level of the first input signal; and the second driving circuit includes a second inverter that receives a second input signal and supplies an inverted second input signal to the gate of the N-channel output transistor, where each of the third and the fourth switches changes between the ON- and OFF-states synchronously with a change of a logical level of the second input signal.

10. The output buffer circuit according to claim 9, wherein:

the first switch is a first N-channel transistor having a gate to which the first input signal is input, and the second switch is a second N-channel having a gate to which the inverted first input signal is input; and the third switch is a first P-channel transistor having a gate to which the second input signal is input, and the fourth switch is a second P-channel having a gate to which the inverted second input signal is input.

* * * * *